United States Patent
Fukumoto et al.

(10) Patent No.: US 10,049,842 B2
(45) Date of Patent: Aug. 14, 2018

(54) RELAY UNIT FOR PERFORMING INSULATION DIAGNOSIS AND METHOD FOR CONTROLLING SAME

(71) Applicant: OMRON Corporation, Kyoto-shi, Kyoto (JP)

(72) Inventors: Tetsuya Fukumoto, Kusatsu (JP); Toshiyuki Higuchi, Kusatsu (JP); Kohei Murakami, Kusatsu (JP); Satoshi Fujii, Kusatsu (JP)

(73) Assignee: OMRON Corporation, Kyoto-shi (JP)

( * ) Notice: Subject to any disclaimer, the term of this patent is extended or adjusted under 35 U.S.C. 154(b) by 199 days.

(21) Appl. No.: 14/879,440

(22) Filed: Oct. 9, 2015

(65) Prior Publication Data
US 2016/0225560 A1 Aug. 4, 2016

(30) Foreign Application Priority Data
Feb. 2, 2015 (JP) .................... 2015-018895

(51) Int. Cl.
H01H 47/00 (2006.01)
G01R 31/12 (2006.01)
G01R 31/327 (2006.01)
G01R 31/02 (2006.01)

(52) U.S. Cl.
CPC ......... *H01H 47/002* (2013.01); *G01R 31/028* (2013.01); *G01R 31/1263* (2013.01); *G01R 31/3278* (2013.01); *H01H 47/004* (2013.01)

(58) Field of Classification Search
CPC ... H01F 7/1844; H01F 7/1816; H01H 47/325; H01H 47/002; H01H 67/24; H01H 47/004; H01H 33/6662; H01H 47/0073; H01H 47/007; H01H 59/0009; H01H 9/542; F01L 9/04; F02D 41/20; F02D 2041/2027; H02H 11/00; H02H 3/093; H02H 3/0935; H02H 3/087; H02H 3/08; H02H 3/006;
(Continued)

(56) References Cited

U.S. PATENT DOCUMENTS 5,574,320 A * 11/1996 Shirai ................. H01H 47/002
307/102
5,748,427 A * 5/1998 Yerkovich ............ A61N 1/3931
128/908
(Continued)

FOREIGN PATENT DOCUMENTS

DE 102006054877 A1 5/2008
EP 1202313 A1 * 5/2002 ........... H01H 47/002
(Continued)

OTHER PUBLICATIONS

Japanese Office Action (JPOA) dated May 22, 2018 in a counterpart Japanese patent application.

*Primary Examiner* — Thienvu Tran
*Assistant Examiner* — Nicolas Bellido
(74) *Attorney, Agent, or Firm* — Metrolexis Law Group, PLLC

(57) ABSTRACT

Provided is a relay unit that can sufficiently suppress defects that are caused by an insulation failure of insulating member that insulates and separates a load power supply from a device power supply, and a method for controlling a relay circuit. A control unit includes an insulating member diagnosis unit that performs diagnosis of an insulation failure of the capacitor.

14 Claims, 5 Drawing Sheets

(58) Field of Classification Search
CPC . H02H 3/044; H02J 9/06; H02J 9/061; G01R 31/3278; G01R 31/1263; G01R 31/028; G01R 31/3277; G01R 31/06; G01R 31/3272; G01R 31/3333; G01R 31/3336; G01R 31/03; H04Q 1/20; G04F 8/08; H03K 17/0822; H03K 17/102; H05B 39/08; B30B 15/148; F16P 3/18; F16P 3/20; H02M 1/088
See application file for complete search history.

(56) References Cited

U.S. PATENT DOCUMENTS

| | | | |
|---|---|---|---|
| 2004/0174074 A1* | 9/2004 | Ehrlich | H01H 47/002 307/125 |
| 2006/0212745 A1* | 9/2006 | Zansky | G01R 31/3277 714/6.12 |
| 2006/0267599 A1* | 11/2006 | Pooranakaran | G01R 27/2605 324/681 |
| 2009/0251835 A1* | 10/2009 | Meinherz | H01H 47/004 361/91.1 |
| 2013/0096853 A1 | 4/2013 | Mahalingam et al. | |
| 2014/0169038 A1* | 6/2014 | Kamath | H03D 3/00 363/16 |

FOREIGN PATENT DOCUMENTS

| | | |
|---|---|---|
| JP | S52-122455 A | 10/1977 |
| JP | H05-055435 U | 7/1993 |
| JP | H06-342024 A | 12/1994 |
| JP | H09-293440 A | 11/1997 |
| JP | 2005-505109 A | 2/2005 |
| JP | 2013-89596 A | 5/2013 |
| TW | 577993 B | 3/2004 |

\* cited by examiner

RELAY UNIT FOR PERFORMING INSULATION DIAGNOSIS AND METHOD FOR CONTROLLING SAME

CROSS-REFERENCE TO RELATED APPLICATION

This application claims priority to Japanese Patent Application No. 2015-018895 filed Feb. 2, 2015, the entire contents of which are incorporated herein by reference.

FIELD

The present invention relates to a relay unit including an insulating member for insulating and separating a load power supply for operating a load from a device power supply, which is different from the load power supply, and to a method for controlling a relay circuit.

BACKGROUND

The following configuration is known as a relay unit (relay circuit) that has the function of switching between current flow and no current flow of a load using relays. That is, the relay unit includes an insulating member for insulating and separating a load power supply for operating a load from a device power supply, which is different from this load power supply. Note that the device power supply functions as a power supply for operating mainly a microcomputer (microcontroller) of the relay unit and the like. Examples of the relay unit including the insulating member are disclosed in JP H5-55435U and EP 1202313A.

The specifications of JP 5-55435U (Jul. 23, 1993) and EP 1202313B (May 2, 2002) are examples of background art.

When an insulation failure (such as a short circuit) of the insulating member occurs, there is the risk that the following defects occur: A high voltage may be applied to the relay unit from the load power supply, causing a fault of the relay unit, a voltage may be applied to the load from the device power supply, causing a malfunction of the load, and the like.

Note that as means for preventing various defects that are caused by the insulation failure, it is conceivable to increase the number of insulating members. However, even when the number of insulating members is increased, insulation failures may occur in, for example, all the insulating members due to a common reason. Accordingly, even by increasing the number of the insulating members, it is difficult to sufficiently suppress various defects that are caused by the insulation failures.

The present invention was made in view of the above-described problem, and an objective thereof is to provide a relay unit that can sufficiently suppress defects that are caused by insulation failures of insulating members for insulating and separating a load power supply from a device power supply, and a method for controlling a relay circuit.

SUMMARY

In order to solve the above-described problems, an inventive relay unit includes a switching circuit that includes a relay configured to be connected to a first power supply for operating a load;

a control unit that is operated by a second power supply, which is different from the first power supply; and an insulating member that insulates and separates the first power supply from the second power supply;

wherein the control unit includes an insulating member diagnosis unit that is configured to perform diagnosis of an insulation failure of the insulating member.

Furthermore, in order to solve the above-described problems, an inventive method for controlling a relay circuit is provided, the relay circuit including a switching circuit that includes a relay configured to be connected to a first power supply for operating a load; and an insulating member that insulates and separates the first power supply from a second power supply, which is different from the first power supply, the method including:

an insulating member diagnosis step of performing diagnosis of an insulation failure of the insulating member.

According to the above-described configuration, the diagnosis of an insulation failure of the insulating member is performed. Therefore, by performing appropriate processing (such as stopping the relay unit upon detection of an insulation failure) based on a result of this insulation failure diagnosis, it is possible to sufficiently suppress various defects that are caused by an insulation failure of the insulating member.

Furthermore, in the relay unit of the present invention, it is preferable that the control unit includes a first diagnosis-signal output unit that is configured to output a first diagnosis signal, and the insulating member diagnosis unit is configured to perform the diagnosis of an insulation failure of the insulating member based on a first diagnosis-result signal that is obtained by the first diagnosis signal passing through the insulating member.

According to the above-described configuration, the diagnosis of an insulation failure of the insulating member is possible based on a first diagnosis-result signal that is obtained by the first diagnosis signal passing through the insulating member.

Furthermore, in the relay unit of the present invention, it is preferable that the control unit include a second diagnosis-signal output unit that is configured to output a second diagnosis signal; and a switching circuit diagnosis unit that is configured to perform fault diagnosis of the switching circuit based on a second diagnosis-result signal that is obtained by the second diagnosis signal passing through the switching circuit. Furthermore, in the relay unit of the present invention, it is preferable that the control unit include a switching circuit diagnosis unit that is configured to perform the fault diagnosis of the switching circuit based on the first diagnosis-result signal.

According to the above-described configuration, it is possible to further perform the fault diagnosis of the switching circuit. Note that the fault diagnosis of the switching circuit may be performed using the same signal as that of the diagnosis of an insulation failure of the insulating member, or a different signal from that of the diagnosis of an insulation failure of the insulating member.

Furthermore, in the relay unit of the present invention, it is preferable that the insulating member diagnosis unit perform the diagnosis of an insulation failure of the insulating member while current flows through the load. Furthermore, in the relay unit of the present invention, it is preferable that the insulating member diagnosis unit perform the diagnosis of an insulation failure of the insulating member while no current flows through the load.

According to the above-described configuration, it is possible to perform the diagnosis of an insulation failure of the insulating member both while current flows through the load and while no current flows through the load.

Furthermore, in the relay unit of the present invention, it is preferable that the insulating member be a capacitor, the first diagnosis signal be a pulse, and the insulating member diagnosis unit determine that the capacitor has an insulation failure if a digital signal obtained by subjecting the first diagnosis-result signal, which is obtained based on the pulse, to analog-digital conversion has a predetermined pulse width or greater.

If the first diagnosis signal is a pulse, the waveform of the first diagnosis-result signal is a triangular wave due to charge and discharge of the capacitors. If the capacitors are subject to an insulation failure, the greater the degree of the failure is, the closer the waveform of this first diagnosis-result signal to a rectangular wave is. Also, the closer the waveform of the first diagnosis-result signal to a rectangular wave is, the greater the pulse width of a digital signal that is obtained by subjecting this first diagnosis-result signal to analog-digital conversion is. Therefore, it is possible to determine that the capacitors are subject to an insulation failure if this digital signal has a predetermined pulse width or greater. Accordingly, it is possible to detect insulation failures of the capacitors accurately.

Furthermore, in the relay unit of the present invention, it is preferable that the insulating member be a capacitor, an insulating transformer, or a photocoupler.

According to the present invention, it is possible to provide a relay unit that can sufficiently suppress defects that are caused by an insulation failure of an insulating member for insulating and separating a load power supply from a device power supply, and a method for controlling a relay circuit.

DETAILED DESCRIPTION

Embodiments for implementing the present invention will be described with reference to FIGS. 1 and 2.

Figure 1:
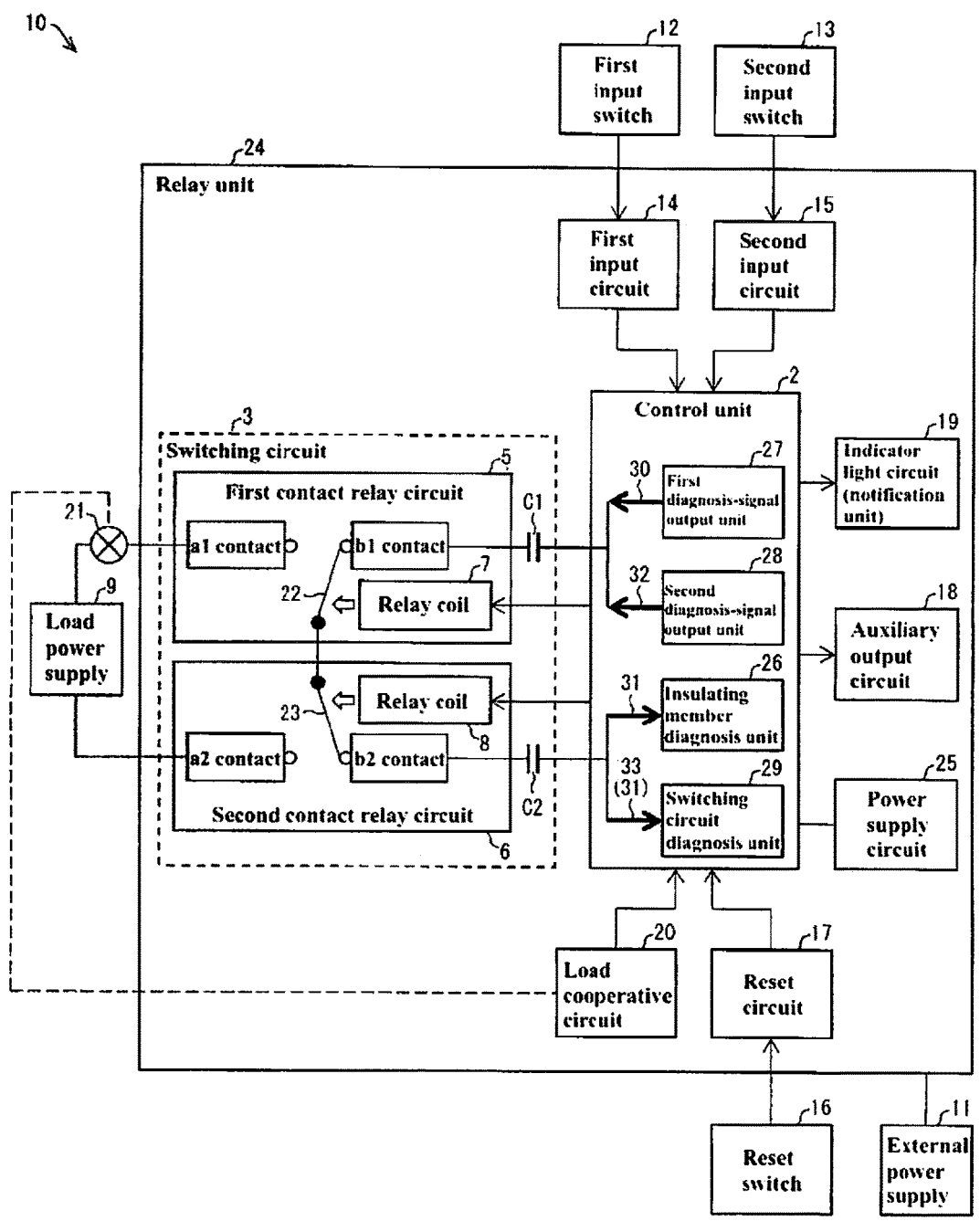
FIG. 1 is a circuit block diagram illustrating a schematic configuration of a load controlling system provided with a relay unit according to the present invention, in which mechanical switches are in the open state.
Figure 2:
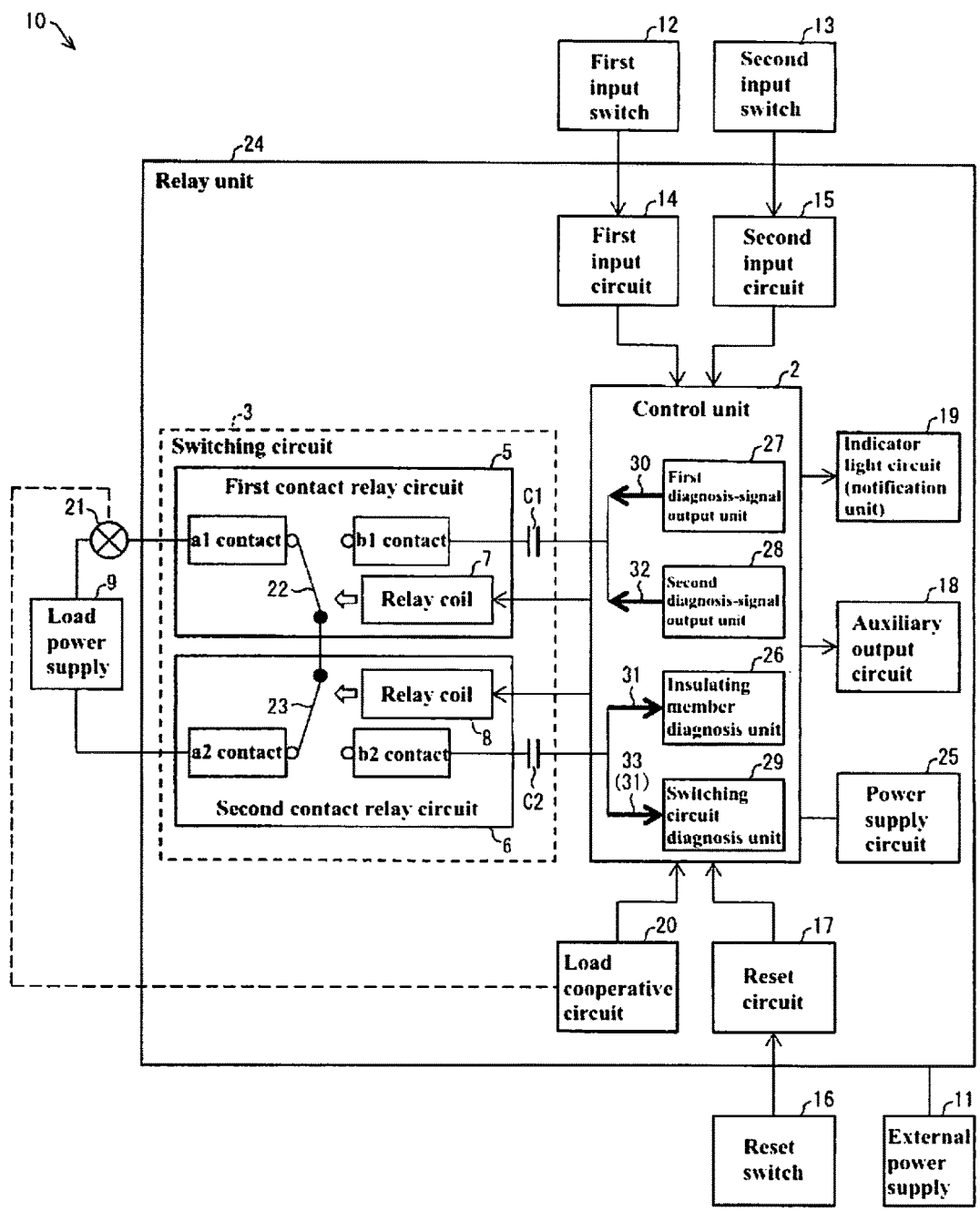
FIG. 2 is a circuit block diagram illustrating a schematic configuration of the load controlling system provided with the relay unit according to the present invention, in which the mechanical switches are in the closed state.

FIGS. 1 and 2 are circuit block diagrams illustrating schematic configurations of a load controlling system 10 provided with a relay unit 24. FIG. 1 shows the state in which mechanical switches 22 and 23 are in the open state, and FIG. 2 shows the state in which the mechanical switches 22 and 23 are in the closed state.

The load controlling system 10 is a system for switching between current flow and no current flow through a load 21 using the relay unit 24. Note that a load power supply (first power supply) 9 is an AC power supply that serves as a power supply for the load 21.

The relay unit 24 includes a control unit 2 and a switching circuit (relay circuit) 3.

The switching circuit 3 includes two contact relays, namely, a first contact relay circuit (relay) 5 and a second contact relay circuit (relay) 6.

The first contact relay circuit 5 includes a mechanical switch 22 and a relay coil 7. The first contact relay circuit 5 generates an electromagnetic force using excitation of the relay coil 7 and uses this electromagnetic force to switch the mechanical switch 22 between the open state and the closed state. Note that the first contact relay circuit 5 includes, as contacts of the mechanical switch 22, an a1 contact, which is a so-called "a" contact, and a b1 contact, which is a so-called "b" contact. In the specification of the present application, "the closed state of the mechanical switch 22" refers to the state in which the mechanical switch 22 is in contact with the a1 contact. On the other hand, in the specification of the present application, "the open state of the mechanical switch 22" refers to the state in which the mechanical switch 22 is in contact with the b1 contact.

The second contact relay circuit 6 includes a mechanical switch 23 and a relay coil 8. The second contact relay circuit 6 generates an electromagnetic force using excitation of the relay coil 8, and uses this electromagnetic force to switch the mechanical switch 23 between the open state and the closed state. Note that the second contact relay circuit 6 includes, as contacts of the mechanical switch 23, an a2 contact, which is a so-called "a" contact, and a b2 contact, which is a so-called "b" contact. In the specification of the present application, "the closed state of the mechanical switch 23" refers to the state in which the mechanical switch 23 is in contact with the a2 contact. On the other hand, in the specification of the present application, "the open state of the mechanical switch 23" refers to the state in which the mechanical switch 23 is in contact with the b2 contact.

Furthermore, the mechanical switches 22 and 23 are connected in series to each other to constitute a series circuit, and this series circuit is connected in series to the load 21 and the load power supply 9. Accordingly, when all the mechanical switches 22 and 23 are put in the closed state, current starts to flow through the load 21. On the other hand, when at least one of the mechanical switches 22 and 23 is put in the open state, the current flow through the load 21 is interrupted.

Furthermore, the switching circuit 3 includes two capacitors (insulating members) C1 and C2. These capacitors C1 and C2 are provided to insulate and separate the load power supply 9 from an external power supply (second power supply) 11. The capacitor C1 is connected between a b1 contact of a first contact relay circuit 5 and the control unit 2, and the capacitor C2 is connected between a b2 contact of a second contact relay circuit 6 and the control unit 2. The capacitor C1 may be provided outside the switching circuit 3, and also the capacitor C2 may be provided outside the switching circuit 3. Instead of the capacitor C1, an insulating transformer or a photocoupler may be used, and also instead of the capacitor C2, an insulating transformer or a photocoupler may be used. The reason is that an insulating transformer and a photocoupler can also function as an insulating member.

The control unit 2 includes one or more microcomputers (microcontrollers), and is configured to perform overall control of the relay unit 24. Particularly, the control unit 2 controls switching of the mechanical switches 22 and 23 by controlling whether or not to excite each of the relay coils 7 and 8. Note that the external power supply 11 is a DC power supply serving as a power supply for the relay unit 24, and supplies power to the control unit 2 via a power supply circuit 25 included in the relay unit 24. If the control unit 2 includes a plurality of microcomputers, which perform the same processing, the processing is made redundant and more accurate control is possible, making the load controlling system 10 safer.

Furthermore, the relay unit 24 includes a first input circuit 14, a second input circuit 15, a reset circuit 17, an auxiliary output circuit 18, an indicator light circuit (notification unit) 19, and a load cooperative circuit 20. Furthermore, in the load controlling system 10, a first input switch 12, a second input switch 13, and a reset switch 16 are connected to the relay unit 24.

The first input switch 12 and the second input switch 13 may respectively be, for example, an emergency stop switch and a safety sensor, and are provided in order to reliably operate the load controlling system 10. The first input circuit 14 converts a signal generated by on/off switching of the first input switch 12 into a signal of a format that can be processed appropriately by the control unit 2 and supplies the converted signal to the control unit 2. The second input circuit 15 converts a signal generated by on/off switching of the second input switch 13 into a signal of a format that can be processed appropriately by the control unit 2 and supplies the converted signal to the control unit 2.

The reset switch 16 is a manual switch that is provided in order to operate reliably, together with the first input switch 12 and the second input switch 13, the load controlling system 10. The reset circuit 17 converts a signal generated by pressing of the reset switch 16 into a signal of a format that can be processed appropriately by the control unit 2, and supplies the converted signal to the control unit 2.

The auxiliary output circuit 18 is a circuit for use in, for example, controlling of the load controlling system 10 by an external device (not shown), and outputs a result of detecting whether current flows or does not flow through the load 21 to the outside of the load controlling system 10.

The indicator light circuit 19 emits light or blinks depending on the state of the load controlling system 10, and performs notification so that the state of the load controlling system 10 can be viewed.

The load cooperative circuit 20 is associated with the state and/or operation of the load 21, and is configured to convert a signal that is generated depending on, for example, various types of states and/or operations of the load 21 into a signal of a format that can be processed appropriately by the control unit 2, and supplies the converted signal to the control unit 2.

Meanwhile, when all the mechanical switches 22 and 23 are in the open state, a signal output from the control unit 2 can pass through the capacitor C1, the mechanical switch 22, the mechanical switch 23, and the capacitor C2 in the stated order, and can return to the control unit 2.

The control unit 2 includes an insulating member diagnosis unit 26, a first diagnosis-signal output unit 27, a second diagnosis-signal output unit 28, and a switching circuit diagnosis unit 29.

The insulating member diagnosis unit 26 performs diagnosis of insulation failures (such as short circuits) of the capacitors C1 and C2.

The first diagnosis-signal output unit 27 outputs a first diagnosis signal 30. This first diagnosis signal 30 passes through the capacitor C1, the mechanical switch 22, the mechanical switch 23, and the capacitor C2 in the stated order, and is supplied as a first diagnosis-result signal 31 to the insulating member diagnosis unit 26. The insulating member diagnosis unit 26 performs the diagnosis of insulation failures of the capacitors C1 and C2 based on this first diagnosis-result signal 31.

The second diagnosis-signal output unit 28 outputs a second diagnosis signal 32. This second diagnosis signal 32 passes through the capacitor C1, the mechanical switch 22, the mechanical switch 23, and the capacitor C2 in the stated order, and is supplied as a second diagnosis-result signal 33 to the switching circuit diagnosis unit 29.

The switching circuit diagnosis unit 29 performs fault diagnosis of the switching circuit 3 based on the second diagnosis-result signal 33.

Examples of the principles of the fault diagnosis of the switching circuit 3 include the followings. That is, a plurality of second diagnosis signals 32 are output from the second diagnosis-signal output unit 28. If second diagnosis-result signals 33 have appropriately been obtained from all the second diagnosis signals 32, the switching circuit diagnosis unit 29 determines that the switching circuit 3 does not have a fault. Conversely, if no second diagnosis-result signal 33 has appropriately been obtained from at least one of the second diagnosis signal 32, the switching circuit diagnosis unit 29 determines that the switching circuit 3 has a fault. Note that according to the same principles, the switching circuit diagnosis unit 29 may perform the fault diagnosis of the switching circuit 3 based on the first diagnosis-result signals 31.

Figure 3:
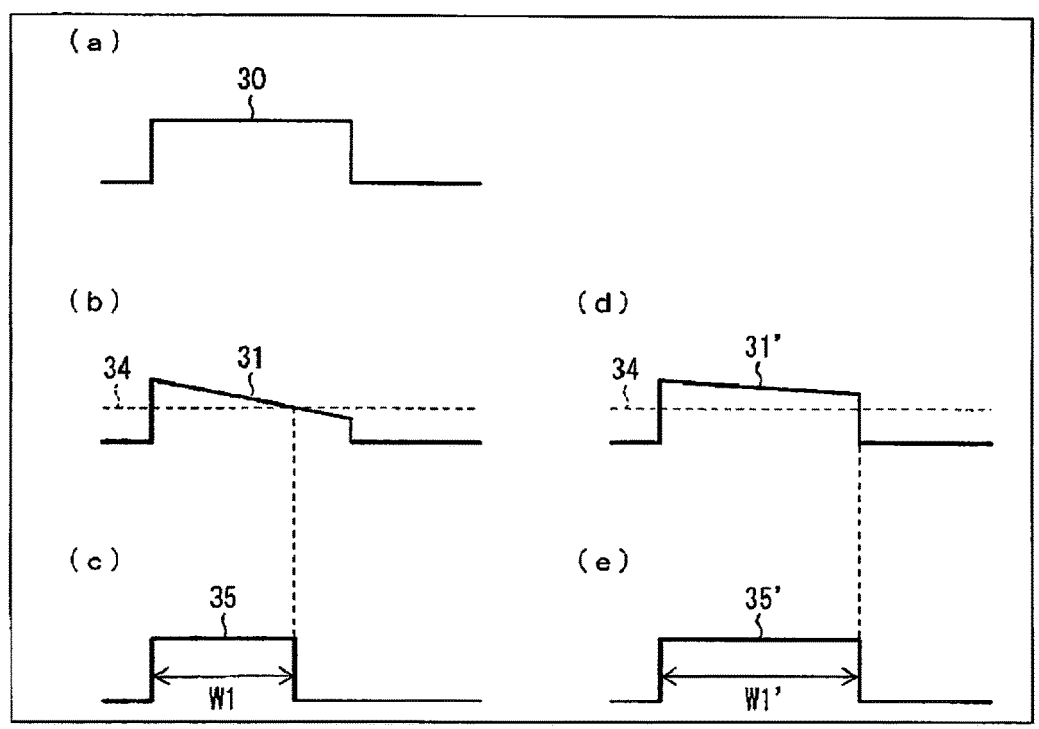
FIG. 3 shows waveform charts illustrating the principles of diagnosis of insulation failures of insulating members, the diagnosis being performed by an insulating member diagnosis unit and a first diagnosis-signal output unit.

FIG. 3 shows waveform charts illustrating the principles of the diagnosis of insulation failures of the capacitors C1 and C2 by the insulating member diagnosis unit 26 and the first diagnosis-signal output unit 27.

Plot (a) in FIG. 3 shows the waveform of the first diagnosis signal 30 immediately after having been output from the first diagnosis-signal output unit 27. As shown in Plot (a) in FIG. 3, the first diagnosis signal 30 is a pulse.

Plot (b) in FIG. 3 shows the waveform of the first diagnosis-result signal 31 immediately before being input to the insulating member diagnosis unit 26 when the capacitors C1 and C2 do not have an insulation failure. When the first diagnosis signal 30 is a pulse, the waveform of the first diagnosis-result signal 31 is a triangular wave as shown in Plot (b) in FIG. 3 due to charge and discharge of the capacitors C1 and C2.

The insulating member diagnosis unit 26 compares the signal level of the first diagnosis-result signal 31 shown in Plot (b) in FIG. 3 with an analog-digital conversion threshold 34. If the signal level of the first diagnosis-result signal 31 is the analog-digital conversion threshold 34 or greater, a high-level signal will be output, and if the signal level of the first diagnosis-result signal 31 is smaller than the analog-digital conversion threshold 34, a low-level signal will be output. Accordingly, the insulating member diagnosis unit 26 subjects the first diagnosis-result signal 31 to analog-digital conversion so as to convert the first diagnosis-result signal 31 into a digital signal 35 shown in Plot (c) in FIG. 3. The pulse width of the digital signal 35 is taken as a pulse width W1.

On the other hand, if the capacitors C1 and C2 have an insulation failure, the greater the degree of the failure is, the closer the waveform of the first diagnosis-result signal 31 that is immediately before being input to the insulating member diagnosis unit 26 is to a rectangular wave. That is, as shown in Plot (d) in FIG. 3, the waveform of a first diagnosis-result signal 31', which is the first diagnosis-result signal 31 when this insulation failure is present, is closer to a rectangular wave than the waveform of the first diagnosis-result signal 31 shown in Plot (b) in FIG. 3. This is because when this insulation failure is present, the capacity of the circuit increases and the discharge time is extended.

The insulating member diagnosis unit 26 compares the signal level of the first diagnosis-result signal 31' shown in Plot (d) in FIG. 3 with the analog-digital conversion threshold 34. The insulating member diagnosis unit 26 then subjects the first diagnosis-result signal 31' to analog-digital conversion so as to convert the first diagnosis-result signal 31' into a digital signal 35' (the digital signal 35 when the capacitors C1 and C2 have an insulation failure) shown in Plot (c) in FIG. 3. A pulse width W1' is longer than the pulse width W1, where the pulse width W1' is the pulse width of the digital signal 35'.

As described above, the insulating member diagnosis unit 26 can determine that the capacitors C1 and C2 have an insulation failure when the digital signal 35 has a predetermined pulse width or greater. At that time, the "predetermined (pulse width)" may be, for example, any width exceeding the pulse width W1. Accordingly, it is possible to accurately detect insulation failures of the capacitors C1 and C2.

Note that the insulating member diagnosis unit 26 may perform the diagnosis of insulation failures of the capacitors C1 and C2 while current flows through the load 21, or may perform the diagnosis of insulation failures of the capacitors C1 and C2 while no current flows through the load 21.

Figure 4:
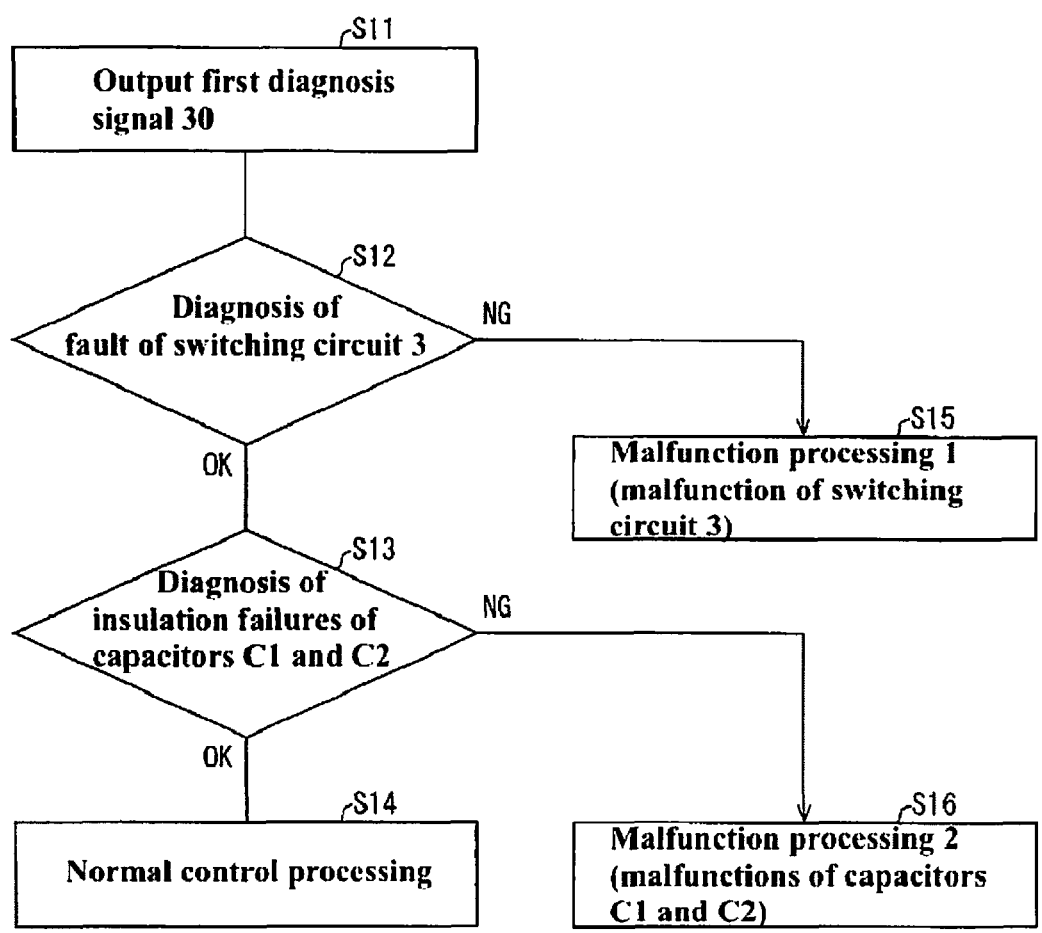
FIG. 4 is a flowchart illustrating the flow of processing that is performed by a control unit using the insulating member diagnosis unit, the first diagnosis-signal output unit, and a switching circuit diagnosis unit.

FIG. 4 is a flowchart illustrating the flow of the processing of the control unit 2 using the insulating member diagnosis unit 26, the first diagnosis-signal output unit 27, and the switching circuit diagnosis unit 29.

First, the first diagnosis-signal output unit 27 outputs the first diagnosis signal 30. Accordingly, the first diagnosis-result signal 31 is supplied to the insulating member diagnosis unit 26 and the switching circuit diagnosis unit 29 (step S11).

The switching circuit diagnosis unit 29 performs fault diagnosis of the switching circuit 3 based on the first diagnosis-result signal 31 (step S12).

If, as a result of the diagnosis, a fault of the switching circuit 3 has been detected (the result of step S12 shows NG), processing associated with a malfunction of the switching circuit 3 (malfunction processing 1) is performed (step S15).

If, as a result of the diagnosis, no fault of the switching circuit 3 has been detected (the result of step S12 shows OK), the insulating member diagnosis unit 26 performs diagnosis of insulation failures of the capacitors C1 and C2 based on the first diagnosis-result signal 31 (step S13). That is, the insulating member diagnosis unit 26 detects whether or not the digital signal 35 has a predetermined pulse width or greater according to the principles that have been described above with reference to FIG. 3.

If, as a result of the diagnosis, insulation failures of the capacitors C1 and C2 have been detected (the result of step S13 shows NG), processing associated with the malfunctions of the capacitors C1 and C2 (malfunction processing 2) is performed (step S16).

If, as a result of the diagnosis, no insulation failures of the capacitors C1 and C2 have been detected (the result of step S13 shows OK), the relay unit 24 performs normal operation (normal control processing) (step S14).

Note that examples of the malfunction processing 1 and 2 include various types of processing for ensuring the safety of the load control system 10 such as shut-down of the relay unit 24.

According to the flow of the operation shown in the flowchart of FIG. 4, the number of processing steps can be reduced, and thus there is the advantage that the processing time is reduced.

Figure 5:
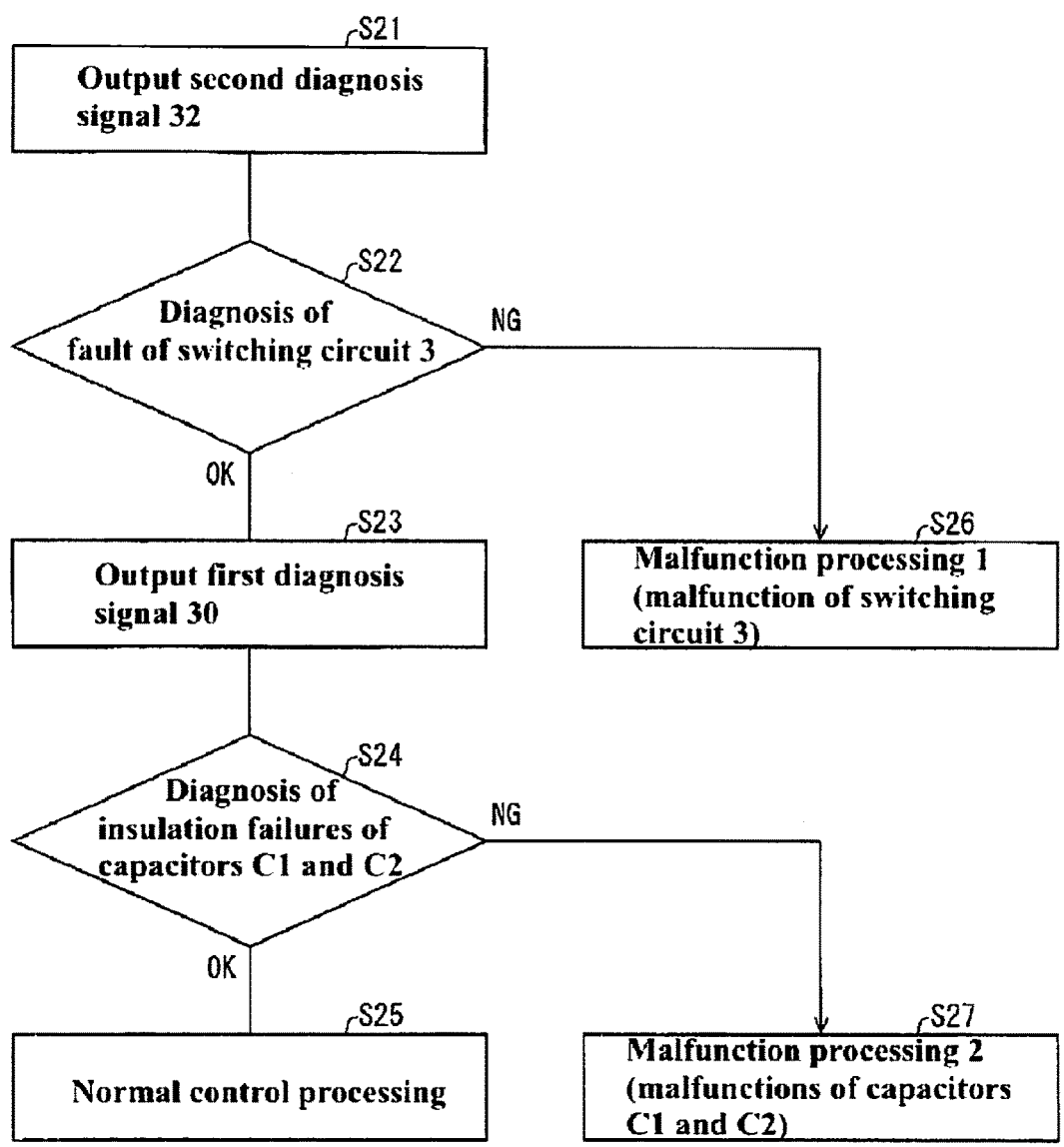
FIG. 5 is a flowchart illustrating the flow of processing that is performed by the control unit using the insulating member diagnosis unit, the first diagnosis-signal output unit, a second diagnosis-signal output unit, and the switching circuit diagnosis unit.

FIG. 5 is a flowchart showing the flow of the processing of the control unit 2 using the insulating member diagnosis unit 26, the first diagnosis-signal output unit 27, the second diagnosis-signal output unit 28, and the switching circuit diagnosis unit 29.

First, the second diagnosis-signal output unit 28 outputs the second diagnosis signal 32. Accordingly, the second diagnosis-result signal 33 is supplied to the switching circuit diagnosis unit 29 (step S21).

The switching circuit diagnosis unit 29 performs fault diagnosis of the switching circuit 3 based on the second diagnosis-result signal 33 (step S22).

If, as a result of the diagnosis, a fault of the switching circuit 3 has been detected (the result of step S22 shows NG), processing associated with a malfunction of the switching circuit 3 (malfunction processing 1) is performed (step S26).

If, as a result of the diagnosis, no fault of the switching circuit 3 has been detected (the result of step S22 shows OK), the first diagnosis-signal output unit 27 outputs the first diagnosis signal 30. Accordingly, the first diagnosis-result signal 31 is supplied to the insulating member diagnosis unit 26 (step S23).

The insulating member diagnosis unit 26 performs diagnosis of insulation failures of the capacitors C1 and C2 based on the first diagnosis-result signal 31 (step S24). That is, the insulating member diagnosis unit 26 detects whether or not the digital signal 35 has a predetermined pulse width or greater, according to the principles that have been described above with reference to FIG. 3.

If, as a result of the diagnosis, insulation failures of the capacitors C1 and C2 have been detected (the result of step S24 shows NG), processing associated with malfunctions of the capacitors C1 and C2 (malfunction processing 2) is performed (step S27).

If, as a result of the diagnosis, no insulation failures of the capacitors C1 and C2 have been detected (the result of step S24 shows OK), the relay unit 24 performs normal operation (normal control processing) (step S25).

According to the flow of the operation shown in the flowchart of FIG. 5, it is possible to perform the fault diagnosis of the switching circuit 3 and the diagnosis of insulation failures of the capacitors C1 and C2 separately, and thus there is the advantage that the diagnosis accuracy can easily be improved.

Hereinafter, the flow of the operation of the load controlling system 10 will be described briefly with reference to the following items (1) to (8). Note that in the initial state of the load controlling system 10, the external power supply 11, the first input switch 12, the second input switch 13, and the reset switch 16 are in the OFF state, and the load cooperative circuit 20 is in the ON state. Furthermore, in the same initial state, both the mechanical switches 22 and 23 are in the open state.

(1) The external power supply 11 is turned on and thereby the control unit 2 is started.

(2) The first input switch 12 and the second input switch 13 are turned on. Thereby, the load controlling system 10 is put in a safe state.

(3) The reset switch 16 is pressed and then the pressing is released.

(4) The control unit 2 recognizes that the item (2) has been performed based on signals supplied from the first input circuit 14 and the second input circuit 15. Furthermore, the control unit 2 recognizes that the item (3) has been performed based on a signal supplied form the reset circuit 17.

(5) Fault diagnosis of the switching circuit 3 and diagnosis of insulation failures of the capacitors C1 and C2 are performed.

(6) The control unit 2 excites the relay coil 7 and 8. This makes it possible for the mechanical switches 22 and 23 to be put in the closed state.

(7) When both the mechanical switches 22 and 23 are switched to the closed state, current flow through the load 21 is started.

(8) When at least one of the first input switch 12 and the second input switch 13 is turned off, both the mechanical switches 22 and 23 are put in the open state and the current flow through the load 21 is interrupted.

In relay unit 24, the insulating member diagnosis unit 26, the first diagnosis-signal output unit 27, the second diagnosis-signal output unit 28, and the switching circuit diagnosis unit 29 are realized by the control unit 2. However, various circuits (hardware) for realizing the same functions as those of the insulating member diagnosis unit 26, the first diagnosis-signal output unit 27, the second diagnosis-signal output unit 28, and the switching circuit diagnosis unit 29 may be used.

The description above is given taking a case in which two contact relays, namely, the first contact relay circuit 5 and the second contact relay circuit 6 are used as an example, but three contact relays or more may be used. Furthermore, instead of contact relay, non-contact relay may be used.

The above description will apply similarly to the case where the switching circuit 3 is controlled to realize the same function as that of the relay unit 24. That is, the present invention encompasses a method for controlling the switching circuit 3, and in this case, it can be construed that the control unit 2 of the load controlling system 10 executes the insulation member diagnosis step.

The present invention is not limited to the above-described embodiments, and various modifications are possible within the scope indicated in the Claims. The technical scope of the present invention also encompasses embodiments obtained by suitably combining technical means disclosed in different embodiments.

INDUSTRIAL APPLICABILITY

The present invention is applicable to a relay unit including an insulating member for insulating and separating a load power supply for operating a load from a device power supply, which is different from the load power supply, and to a method for controlling a relay circuit.

The invention claimed is:

1. A relay unit comprising:
a switching circuit comprising a relay connected to a first power supply for operating a load;
a control unit powered by a second power supply-different from the first power supply; and
an insulating member that insulates the first power supply from the second power supply, wherein:
the control unit comprises:
an insulating member diagnosis unit; and
a first diagnosis-signal output unit; and
the control unit is configured to perform processing operations comprising:
outputting a first diagnosis signal via the first diagnosis-signal output unit; and
diagnosing, via the insulating member diagnosis unit, an insulation failure of the insulating member based on a first diagnosis-result signal obtained by the first diagnosis signal passing through the insulating member.

2. The relay unit according to claim 1, wherein the control unit comprises:
a second diagnosis-signal output unit; and
a switching circuit diagnosis unit, wherein
the control unit is configured to perform processing operations further comprising:
outputting a second diagnosis signal via the second diagnosis-signal output unit; and
diagnosing, via the switching circuit diagnosis unit, a fault of the switching circuit based on a second diagnosis-result signal obtained by the second diagnosis signal passing through the switching circuit.

3. The relay unit according to claim 1, wherein:
the control unit comprises a switching circuit diagnosis unit; and
the control unit is configured to perform processing operations further comprising diagnosing, via the switching circuit diagnosis unit, a fault of the switching circuit based on the first diagnosis-result signal.

4. The relay unit according to claim 1, wherein the control unit is configured to perform processing operations such that diagnosing the insulation failure of the insulating member via the insulating member diagnosis unit comprises diagnosing, via the insulating member diagnosis unit, the insulation failure of the insulating member while current flows through the load.

5. The relay unit according to claim 1, wherein the control unit is configured to perform processing operations such that diagnosing the insulation failure of the insulating member via the insulating member diagnosis unit comprises diagnosing, via the insulating member diagnosis unit, the insulation failure of the insulating member while no current flows through the load.

6. The relay unit according to claim 1, wherein
the insulating member comprises a capacitor;
the first diagnosis signal comprises a pulse; and
the control unit is configured to perform operations further comprising determining, via the insulating member diagnosis unit, an insulation failure of the capacitor when a digital signal has a predetermined pulse width or greater, the digital signal being obtained by performing analog-digital conversion on the first diagnosis-result signal, and the first diagnosis-result signal is obtained based on the pulse.

7. The relay unit according to claim 1, wherein the insulating member is one of: a capacitor; an insulating transformer; and a photocoupler.

8. A method for controlling a relay circuit, the relay circuit comprising:
a switching circuit comprising a relay connected to a first power supply for operating a load;
a control unit comprising: an insulating member diagnosis unit and powered by a second power supply; and a first diagnosis-signal output unit; and
an insulating member that insulates the first power supply and the relay from the second power supply;
the method comprising:
outputting by the control unit a first diagnosis signal via the first diagnosis-signal output unit; and
diagnosing an insulation failure of the insulating member via the insulating member diagnosis unit comprising diagnosing the insulation failure, via the insulating member diagnosis unit, of the insulating member based on a first diagnosis-result signal obtained by the first diagnosis signal passing through the insulating member.

9. The method according to claim 8, wherein the control unit comprises a second diagnosis-signal output unit and a switching circuit diagnosis unit; the method further comprising:
   outputting by the control unit a second diagnosis signal via the second diagnosis-signal output unit; and
   diagnosing the switching circuit, via the switching circuit diagnosis unit, based on a second diagnosis-result signal obtained by the second diagnosis signal passing through the switching circuit.

10. The method according to claim 8, wherein
   the control unit comprises a switching circuit diagnosis unit; and
   the method further comprises diagnosing, via the switching circuit diagnosis unit, a fault of the switching circuit based on the first diagnosis-result signal.

11. The method according to claim 8, wherein diagnosing the insulation failure of the insulating member via the insulating member diagnosis unit comprises diagnosing the insulation failure of the insulating member, via the insulating member diagnosis unit, while current flows through the load.

12. The method according to claim 8, wherein diagnosing the insulation failure of the insulating member via the insulating member diagnosis unit comprises diagnosing the insulation failure of the insulating member, via the insulating member diagnosis unit, while no current flows through the load.

13. The method according to claim 8, wherein
   the insulating member comprises a capacitor;
   the first diagnosis signal comprises a pulse; and
   the method further comprising determining, via the insulating member diagnosis unit, that the insulation failure of the insulating member exists in a condition in which a digital signal obtained by performing analog to digital conversion on the first diagnosis-result signal has a predetermined pulse width or greater.

14. The method according to claim 8, wherein the insulating member is one of: a capacitor; an insulating transformer; and a photocoupler.

* * * * *